(12) United States Patent
Perälä et al.

(10) Patent No.: US 11,288,502 B2
(45) Date of Patent: Mar. 29, 2022

(54) ILLUMINATION SYSTEM, ELECTRONIC DEVICE COMPRISING AN ILLUMINATION SYSTEM AND USE OF AN ILLUMINATION SYSTEM

(71) Applicant: OSRAM Opto Semiconductors GmbH, Regensburg (DE)

(72) Inventors: Mikko Perälä, Tampere (FI); Désirée Queren, Neutraubling (DE); Marco Antretter, Parkstetten (DE)

(73) Assignee: OSRAM OLED GMBH, Regensburg (DE)

( * ) Notice: Subject to any disclaimer, the term of this patent is extended or adjusted under 35 U.S.C. 154(b) by 142 days.

(21) Appl. No.: 16/488,148

(22) PCT Filed: Feb. 22, 2018

(86) PCT No.: PCT/EP2018/054425
§ 371 (c)(1),
(2) Date: Aug. 22, 2019

(87) PCT Pub. No.: WO2018/154008
PCT Pub. Date: Aug. 30, 2018

(65) Prior Publication Data
US 2020/0042789 A1    Feb. 6, 2020

(30) Foreign Application Priority Data

Feb. 24, 2017 (DE) .......................... 102017103884.1

(51) Int. Cl.
*G06K 9/00* (2006.01)
*G06K 9/20* (2006.01)
(Continued)

(52) U.S. Cl.
CPC ....... *G06K 9/00604* (2013.01); *G06K 9/2027* (2013.01); *H01L 23/5386* (2013.01);
(Continued)

(58) Field of Classification Search
CPC combination set(s) only.
See application file for complete search history.

(56) References Cited

U.S. PATENT DOCUMENTS 6,107,618 A * 8/2000 Fossum ................. H01L 25/167
250/208.1
7,826,728 B2   11/2010 Konno et al.
(Continued)

FOREIGN PATENT DOCUMENTS

DE    102009047788 A1    3/2011
DE    102014112681 A     3/2016
(Continued)

*Primary Examiner* — Jay C Chang
(74) *Attorney, Agent, or Firm* — Slater Matsil, LLP

(57) ABSTRACT

An illumination dystem, an electronic Device and a method for using an illumination device are disclosed. In an embodiment an illumination device includes at least one semiconductor component configured to generate radiation, an optical element and a control circuit, wherein the optical element is configured to direct the radiation into a field of view to be illuminated, wherein the semiconductor component has a plurality of pixels of a first type, each pixel configured to illuminate the field of view in regions with radiation in a visible spectral range, and at least one infrared pixel configured to illuminate the field of view at least in regions with radiation in an infrared spectral range, wherein the pixels of the first type are arranged in a first matrix arrangement and the infrared pixels are arranged in a second matrix arrangement, and wherein the pixels of the first type and the at least one infrared pixel are operable via the control circuit.

20 Claims, 7 Drawing Sheets

(51) Int. Cl.
    *H01L 23/538* (2006.01)
    *H01L 25/075* (2006.01)
    *H01L 25/16* (2006.01)
    *H01L 33/50* (2010.01)

(52) U.S. Cl.
    CPC ........ *H01L 25/0753* (2013.01); *H01L 25/167* (2013.01); *H01L 33/50* (2013.01)

(56) References Cited

U.S. PATENT DOCUMENTS

| | | |
|---|---|---|
| 7,978,883 B2 | 7/2011 | Rouh et al. |
| 8,577,218 B2 | 11/2013 | von Malm et al. |
| 9,192,021 B2 | 11/2015 | Häfner et al. |
| 9,362,335 B2 | 6/2016 | von Malm |
| 2004/0114921 A1 | 6/2004 | Braun et al. |
| 2007/0098391 A1 | 5/2007 | Howard et al. |
| 2007/0153495 A1 | 7/2007 | Wang (Michael) et al. |
| 2008/0029701 A1 | 2/2008 | Onozawa et al. |
| 2008/0137357 A1* | 6/2008 | Friedrichs ............... F21S 41/13 362/507 |
| 2010/0026870 A1 | 2/2010 | Sakemoto |
| 2013/0155644 A1 | 6/2013 | Hamada |
| 2013/0249396 A1 | 9/2013 | Häfner et al. |
| 2015/0227790 A1* | 8/2015 | Smits ................. G06K 9/00604 348/78 |
| 2015/0341619 A1* | 11/2015 | Meir ...................... G01S 17/87 348/47 |
| 2016/0069527 A1 | 3/2016 | Komatsu |
| 2017/0278829 A1 | 9/2017 | Stoll et al. |
| 2017/0293799 A1* | 10/2017 | Skogo ................ G06K 9/00604 |
| 2019/0074411 A1* | 3/2019 | Schlosser ............ H01L 33/50 |
| 2019/0103384 A1* | 4/2019 | Feichtinger ........... H01L 33/641 |
| 2019/0104246 A1* | 4/2019 | Antretter ................. G03B 7/16 |

FOREIGN PATENT DOCUMENTS

| | | |
|---|---|---|
| DE | 102016124866 A1 | 6/2018 |
| DE | 102016124871 A1 | 6/2018 |

* cited by examiner

ILLUMINATION SYSTEM, ELECTRONIC DEVICE COMPRISING AN ILLUMINATION SYSTEM AND USE OF AN ILLUMINATION SYSTEM This patent application is a national phase filing under section 371 of PCT/EP2018/054425, filed Feb. 22, 2018, which claims the priority of German patent application 102017103884.1, filed Feb. 24, 2017, each of which is incorporated herein by reference in its entirety.

TECHNICAL FIELD

The present application relates to an illumination device, an electronic device with such an illumination device and the use of an illumination device.

BACKGROUND

Electronic devices such as smartphones or tablets often have one or more camera systems. However, the usability of these camera systems is limited, for example, in poor visibility conditions.

SUMMARY OF THE INVENTION

Embodiments provide an improvement of the usability and performance of camera systems.

Embodiments provide an illumination device with at least one semiconductor component intended for generating radiation. The semiconductor component, for example, has a semiconductor chip with an active region intended for generating radiation.

According to at least one embodiment of the illumination device, the illumination device has an optical element. The optical element is intended in particular for directing radiation emitted during operation of the semiconductor component into a field of view to be illuminated. In other words, the optical element serves to shape the spatial radiation characteristic. For example, the entire illumination device has exactly one optical element intended for beam shaping. For example, the optical element is a refractive optical element, such as a lens or a Fresnel lens.

According to at least one embodiment of the semiconductor component, the semiconductor component has a plurality of pixels of a first type, each intended for illuminating the field of view in regions with radiation in the visible spectral range. For example, the radiation emitted by the pixels of the first type is white light to the human eye. The pixels of the first type are, for example, individual semiconductor chips or partial regions of one or more semiconductor chips.

In lateral direction, i.e., parallel to a main plane of extension of at least one semiconductor chip, the pixels of the first type are arranged next to one another, so that during operation of the semiconductor component a subarea of the field of view to be illuminated is illuminated by means of a pixel of the first type. The entire field of view can be illuminated by simultaneously activating all pixels of the first type. Subareas of the field of view illuminated by adjacent pixels of the first type can overlap in in regions.

According to at least one embodiment of the illumination device, the semiconductor component has at least one infrared pixel, in particular a plurality of infrared pixels. The infrared pixel/pixels is/are intended to illuminate the field of view in regions with radiation in the infrared spectral range. For example, a peak wavelength of radiation in the infrared spectral range is between and 780 nm and 1.1 µm inclusive. Radiation in this spectral range is not visible to the human eye and detectable by conventional silicon detectors.

According to at least one embodiment of the illumination device, the illumination device has a control circuit. The control circuit is intended in particular to operate the pixels of the first type and the at least one infrared pixel. By means of the control circuit, the pixels of the first type and the at least one infrared pixel can be operated independently of one another and, in particular, simultaneously with different currents and/or different voltages. For example, a common control circuit is intended to control both the pixels of the first type and the at least one infrared pixel. For example, the control circuit has at least one active matrix circuit, in which at least two pixels, in particular all pixels, can be controlled simultaneously. For example, each pixel of the illumination device is associated with a switch of the control circuit, such as a transistor.

In at least one embodiment of the illuminating device, the illuminating device has a semiconductor component intended for generating radiation, an optical element and a control circuit, the optical element directing the radiation emitted during operation of the semiconductor component into a field of view to be illuminated. The semiconductor component has a plurality of pixels of a first type, each intended to illuminate the field of view in regions with radiation in the visible spectral range. The semiconductor component has at least one infrared pixel intended for illuminating the field of view at least in regions with radiation in the infrared spectral range. The pixels of the first type and at least one infrared pixel can be operated via the control circuit.

The illumination device not only provides radiation in the visible spectral range, but also radiation in the infrared spectral range. These radiation components can be superimposed in the field of view at least in places. By subdividing the radiation source into pixels of the first type and infrared pixels, different subareas of the field of view to be illuminated can be illuminated to different degrees with radiation in the visible spectral range and/or radiation in the infrared spectral range.

By using such an illumination device as a light source, in particular as a flashlight in an electronic device such as a smartphone or tablet, the camera system intended for the image generation can be provided with radiation not only in the visible but also in the infrared spectral range. For example, the electronic device has a radiation receiver that can detect radiation in the red, green and blue spectral range as well as radiation in the infrared spectral range. Alternatively, the electronic device can have a radiation receiver for radiation in the red, green and blue spectral range and a further radiation receiver for receiving radiation in the infrared spectral range.

According to at least one embodiment of the illumination device, the pixels of the first type are arranged in a first matrix arrangement and the infrared pixels are arranged in a second matrix arrangement.

In particular, the term 'matrix arrangement' generally refers to a two-dimensional arrangement of a plurality of pixels, for example, in a regular rectangular or hexagonal grid. In particular, the individual elements of the matrix arrangement can be controlled independently of one another.

The first matrix arrangement and the second matrix arrangement are laterally spaced apart from one another. In other words, the pixels of the first type and the infrared pixels are spatially separated next to one another. In particular, no pixel of the first type is located between any two infrared pixels and vice versa. For example, the optical element is formed so that each infrared pixel in the second matrix arrangement is associated with a pixel of the first type in the first matrix arrangement, so that the radiation emitted by the infrared pixel and the associated pixel of the first type overlaps in the field of view.

According to at least one embodiment of the illumination device, the pixels of the first matrix arrangement are formed by a first semiconductor chip and the pixels of the second matrix arrangement are formed by a second semiconductor chip. The pixels of the first matrix arrangement and the pixels of the second matrix arrangement can thus be produced independently of one another and can, for example, also be based on different semiconductor material systems.

A semiconductor chip based on nitride compound semiconductor material, for example, is suitable for generating radiation in the visible spectral range. A semiconductor material based on arsenide compound semiconductor material, for example, is suitable for generating radiation in the infrared spectral range.

Based on "nitride compound semiconductor material" in the present context means that the semiconductor chip or at least a part thereof, particularly preferably at least the active region and/or a growth substrate, comprises or consists of a nitride compound semiconductor material, preferably $Al_xIn_yGa_{1-x-y}N$, wherein $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, N), even if these may be partially replaced and/or supplemented by small quantities of other substances.

Based on "arsenide compound semiconductor material" in the present context means that the semiconductor chip or at least a part thereof, particularly preferably at least the active region and/or a growth substrate, comprises or consists of an arsenide compound semiconductor material, preferably $Al_xIn_yGa_{1-x-y}As$, wherein $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, As), even if these may be partially replaced and/or supplemented by small amounts of other substances.

By using different materials for the semiconductor chips, a particularly high efficiency in the generation of radiation in the respective spectral ranges can be achieved overall.

According to at least one embodiment of the illumination device, the pixels of the first type and the infrared pixels are arranged in a common matrix arrangement. For example, an infrared pixel is located between at least two pixels of the first type. The pixels of the first type and the infrared pixels, for example, are arranged line by line or column by column, alternating or alternating in a chessboard like pattern. The number of first type and infrared pixels and the ratio between the number of first type and infrared pixels can be varied within wide limits depending on the lighting requirements.

According to at least one embodiment of the illumination device, one degree of surface coverage with infrared pixels changes within the common matrix arrangement. For example, the degree of surface coverage with infrared pixels is higher in a central region of the common matrix arrangement than in an edge region of the common matrix arrangement. For example, the edge region surrounds the central region in the form a frame. The infrared pixels are thus increasingly or exclusively arranged in the central region of the common matrix arrangement. Such an arrangement is suitable, for example, if the radiation to be generated by the infrared pixels is predominantly required centrally in the field of view.

According to at least one embodiment, the common matrix arrangement is formed by a plurality of semiconductor chips.

Here, a semiconductor chip can form exactly one pixel or a plurality of pixels. In particular, each semiconductor chip is intended either only for the generation of radiation in the visible spectral range or only for the generation of radiation in the infrared spectral range. The radiation in the respective spectral range can be emitted as primary radiation directly from the semiconductor chip and/or as secondary radiation, which is emitted by a radiation conversion element by excitation by the primary radiation.

By subdividing the common matrix arrangement into several semiconductor chips, the material system suitable for the radiation to be generated can be selected for each pixel. Furthermore, the surface distribution of infrared pixels and pixels in the visible spectral range can be easily adapted to different requirements during production by placing the individual semiconductor chips.

According to at least one embodiment of the illumination device, an intermediate carrier is arranged between the plurality of semiconductor chips and the control circuit, via which the semiconductor chips are electrically conductively connected to the control circuit. The intermediate carrier extends in particular over a plurality of semiconductor chips, for example, over all semiconductor chips of the common matrix arrangement. By means of the intermediate carrier, an electrical contact of the individual contacts of the semiconductor chips with the associated connections of the control circuit can be achieved in a simplified manner. The control circuit and the intermediate carrier may overlap in regions in a plan view. In the lateral direction, a particularly compact design can thus be achieved.

According to at least one embodiment of the illumination device, the pixels of the first type and the infrared pixels of the common matrix arrangement are integrated into a common semiconductor chip. By means of an integrated arrangement of the pixels, particularly small distances between the pixels can be achieved. For example, the pixels of the first type and the infrared pixels result from a common semiconductor layer sequence during the production of the common semiconductor chip. The active regions of the individual pixels intended for the generation of radiation therefore do not differ in terms of layer thickness and material composition, or at most within the scope of fluctuations that occur in the lateral direction during the manufacture of semiconductor chips, for example, during the epitaxial deposition of a semiconductor layer sequence.

For example, the infrared pixels are associated with a radiation conversion element that converts the radiation generated in the active region of the semiconductor chip into radiation in the infrared spectral range.

According to at least one embodiment of the illumination device, the semiconductor component has a plurality of pixels of a second type emitting radiation in the visible spectral range.

In particular, the pixels of the second type emit radiation different from the pixels of the first type in terms of peak wavelength and/or color temperature, for example. For example, the pixels of the first type emit warm white light and the pixels of the second type emit cold white light.

Light with a color temperature between 2000 K and 3500 K inclusive is regarded as warm white light. Light with a color temperature of 3600 K to 7000 K is regarded as cold white light. By means of the ratio of the radiation emitted by the pixels of the first type to the pixels of the second type, the color location of the radiation emitted by the illumination device can be adjusted in the visible spectral range.

According to at least one embodiment of the illumination device, the pixels of the first type, the pixels of the second type and the infrared pixels are arranged in a common matrix arrangement. The common matrix arrangement, for example, has warm white light emitting pixels of the first type, cold white light emitting pixels of the second type and infrared pixels. In particular, the common matrix arrangement can be formed by exactly one semiconductor chip. This is to say that the entire lighting system only requires a semiconductor chip intended for radiation generation and provides both white light with adjustable color temperature and infrared light. Compared to an embodiment with several semiconductor chips, a particularly compact design can be achieved.

According to at least one embodiment of the illumination device, the pixels of the first type are arranged in a first matrix arrangement and the pixels of the second type are arranged in a second matrix arrangement. In particular, both the first matrix arrangement and the second matrix arrangement have a part of the infrared pixels.

According to at least one embodiment of the illumination device, each pixel of the first matrix arrangement is associated with a pixel of the second matrix arrangement so that the radiation emitted by these pixels overlaps in the field of view. In particular, each pixel of the first type in the first matrix arrangement overlaps with a pixel of the second type in the second matrix arrangement, so that for each subarea of the field of view to be illuminated, the color location of the total radiation impinging on this subarea in the visible spectral range can be adjusted.

According to at least one embodiment of the illumination device, a radiation conversion element is associated with the pixels of the first type and/or the pixels of the second type, which at least partially converts a primary radiation into a secondary radiation. For example, the primary radiation is located in the blue spectral range or in the ultraviolet spectral range. The secondary radiation, for example, is located in the blue, green, yellow and/or red spectral range.

For example, the radiation conversion element has a thickness between 40 µm and 100 µm inclusive, in particular between 60 µm and 80 µm inclusive. Radiation conversion elements in this thickness range cause a comparatively strong scattering and thus a spatially widened radiation. It has been shown that an overlap between subareas in the field of view illuminated by adjacent pixels results in improved images when the illumination device is used as a flash.

In particular, it has been shown that for other applications, such as projection applications or an adaptive headlamp system, unwanted optical crosstalk between adjacent pixels when using the described illumination device as a flash leads to improved image generation results.

According to at least one embodiment of the illuminating device, a total luminous area of all infrared pixels of the illuminating device is not more than 80%, for example, 60% or less of a total luminous area of the pixels emitting in the visible spectral range. The lower the proportion of the infrared pixels compared is compared to the total area of the pixels emitting in the visible spectral range, the less radiation power is lost in the visible spectral range when the lateral extension is maintained by the additional infrared pixels.

Further embodiments provide an electronic device. The electronic device has an illumination device with at least one of the features described above. The electronic device is, for example, a hand-held electronic device, such as a mobile communication device such as a smartphone or tablet.

According to at least one embodiment of the electronic device, the electronic device has at least one radiation receiver detecting radiation being radiated into the field of view and reflected back from the field of view. An image of the field of view can be generated by means of the radiation receiver.

According to at least one embodiment of the electronic device, the electronic device has an evaluation unit generating a recording of the field of view based on the radiation received from the radiation receiver in the visible spectral range and in the infrared spectral range. Thus, not only radiation in the visible spectral range is used for the recording, i.e., in particular radiation components in the red, green and blue spectral range, but also radiation in the infrared spectral range. These radiation components can provide additional information of the scene to be recorded that would not be available by radiation in the visible spectral range alone.

Furthermore, radiation in the infrared spectral range can be used to illuminate the field of view without, for example, glaring a person in the field of view. The illumination device is also particularly suitable for recordings in low light or in the dark.

According to at least one embodiment of the electronic device, the electronic device has a housing with an opening through which both the radiation of the pixels of the first type and the radiation of the infrared pixels are emitted. The radiation emitted by the infrared pixels therefore does not require an additional opening in the housing.

Yet further embodiments provide a method for using the illumination device described above as a light source for biometric authentication.

According to at least one embodiment of a use, the authentication is performed by means of an iris scan by illumination by the infrared pixels. The infrared pixels can be used to illuminate the iris without creating an unpleasant glare impression for the human eye.

Such an iris scan may obviate the need to enter passwords or pin numbers as access control and/or provide additional security against unauthorized use.

BRIEF DESCRIPTION OF THE DRAWINGS

Further embodiments and expediencies result from the following description of the exemplary embodiments in connection with the figures.

They show.

Equal, similar or equivalent elements are provided with the same reference signs in the figures.

The figures are schematic representations and therefore not necessarily true to scale. Rather, comparatively small elements and, in particular, layer thicknesses can be displayed exaggeratedly large for clarification.

DETAILED DESCRIPTION OF ILLUSTRATIVE EMBODIMENTS

Figure 1A:
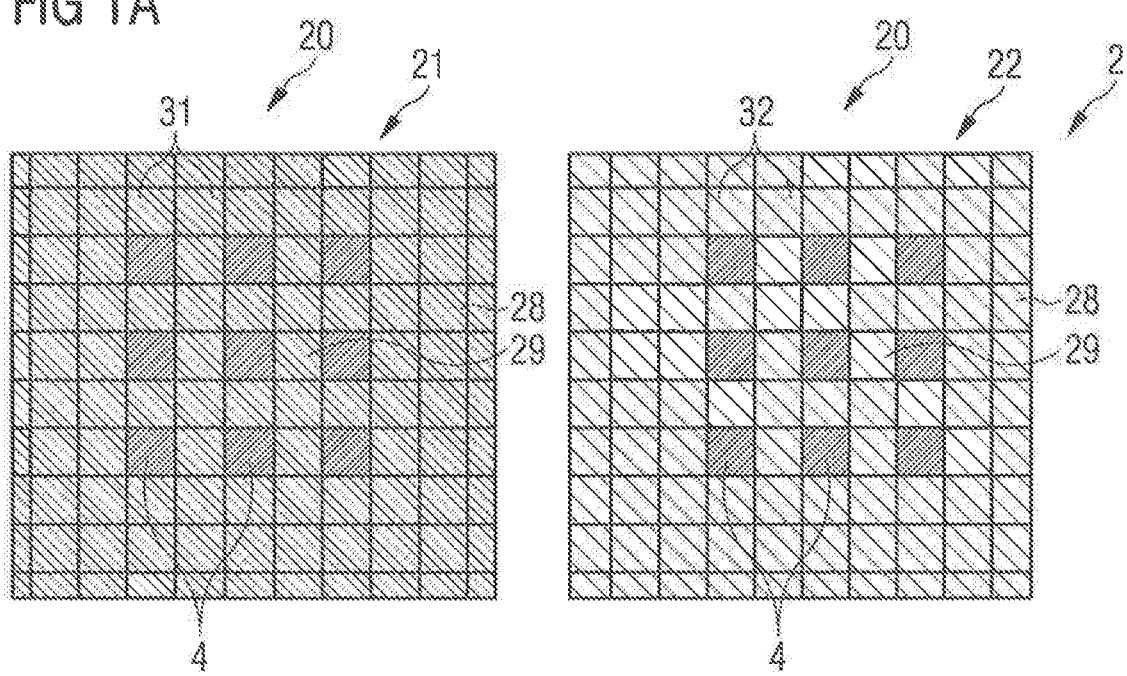
FIGS. 1A and 1B an exemplary embodiment of an illumination device in plan view (FIG. 1A) and in sectional view (FIG. 1B)
Figure 1B:
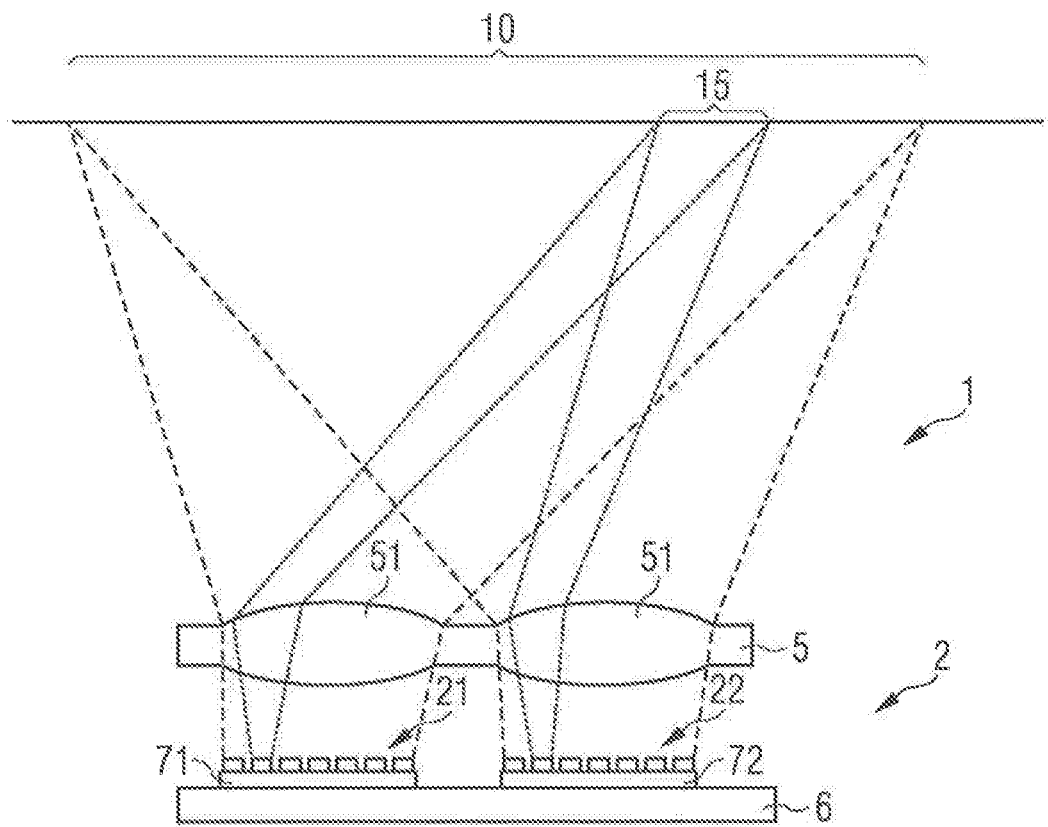

FIGS. 1A and 1B show an exemplary embodiment of an illumination device 1, wherein in the plan view of FIG. 1A only the semiconductor component 2 is shown schematically for simplified illustration.

The radiation emitted during operation of the semiconductor component 2 is directed by means of an optical element 5 into a field of view 10 to be illuminated.

The semiconductor component 2 has a plurality of pixels of the first type 31. The pixels of the first type 31 are arranged in a first matrix arrangement 21. The semiconductor component 2 further comprises a plurality of pixels of the second type 32, wherein the pixels of the second type 32 being arranged in a second matrix arrangement 22. The pixels of the first type and the pixels of the second type are different with regard to their radiation, especially their spectral radiation. For example, pixels of the first type emit light that appears warm white to the human eye and pixels of the second type emit light that appears cold white to the human eye.

The semiconductor component 2 further has a plurality of infrared pixels 4. The infrared pixels 4 are provided both in the first matrix arrangement 21 and in the second matrix arrangement 22. The infrared pixels 4 and the pixels of the first type 31 as well as the infrared pixels 4 and the pixels of the second type 32 are thus each located in a common matrix arrangement 20.

The first matrix arrangement 21 and the second matrix arrangement 22 are arranged next to one another in lateral direction. In plan view of the semiconductor component, the first matrix arrangement and the second matrix arrangement are arranged next to one another without overlapping.

The optical element 5 has a plurality of segments 51, wherein each matrix arrangement is associated with one segment, in particular uniquely. The segments 51 of the optical element are formed in such a way that a pixel of the second matrix arrangement is associated with each pixel of the first matrix arrangement so that the radiation emitted by these pixels in the field of view 10 overlaps in a subarea 15 in particular congruently or substantially congruently. This is shown in FIG. 1B by means of the dotted lines, which schematically define a beam path extending from one pixel each of the first matrix arrangement 21 and the second matrix arrangement 22 starting through the associated segment 51 of the optical element 5 and define the subarea 15 in the field of view 10. However, these beam paths only serve to explain the functional principle and do not represent precise beam paths in the sense of geometric optics.

In FIG. 1B, the segments 51 have a convex shape both on a side facing the semiconductor component 2 and on a side facing away from the semiconductor component. However, the optical element can also be formed differently, for example, in the form of a Fresnel optic for each segment.

Optical elements, with which a superposition of associated pixels in a subarea of a field of view can take place are described in the German patent applications 10 2016 124 871.1 and 10 2016 124 866.5, the entire disclosure content of which is included in the present application by reference.

By varying the current ratio between the pixel of the first type 31 and the associated pixel of the second type 32, the color location in the subarea 15 of the field of view 10 illuminated by these pixels can be adjusted during operation of the illumination device 1.

Each infrared pixel 4 of the first matrix arrangement 21 is also associated with a corresponding infrared pixel 4 of the second matrix arrangement 22. These infrared pixels can be controlled in such a way that their total radiation emitted in the associated subarea of 15 has the desired intensity.

The illumination device 1 also has a control circuit 6, via which the pixels of the first type 31, the pixels of the second type 32 and the infrared pixels 4 can be operated. Possible configurations for the electrical connection between the pixels and the control circuit as well as details of the semiconductor component are described in more detail below using FIGS. 5 to 9.

The number of the pixels of the first type 31 as well as the pixels of the second type 32 and infrared 4 pixels can be varied within wide limits. For example, the illumination device has between including 10 and including woo pixels of the first type. The number of pixels of the first type is preferably equal to the number of pixels of the second type.

In addition to radiation in the visible spectral range, the illumination device 1 also supplies radiation in the infrared spectral range by means of the infrared pixels 4. Different subareas of the field of view can be illuminated to different degrees by different currents applied to the infrared pixels 4. Such an illumination device is particularly suitable as a light source for an electronic device, such as a hand-held electronic device such as a smartphone or a tablet.

Figure 10:
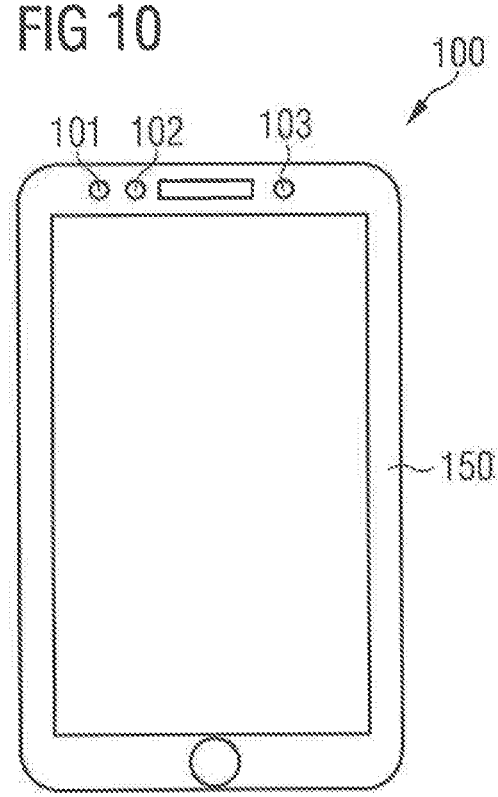
FIG. 10 shows an exemplary embodiment of an electronic device.

FIG. 10 shows an exemplary embodiment of an electronic device 100 in the form of a smartphone. The device 100 has a housing 150, in which the illumination device is arranged. For example, the illumination device is located behind an opening 101 of the housing iso. The device 100 also has a radiation receiver 102 for the spatially resolved detection of radiation in the red, green and blue spectral range as well as a further radiation receiver 103 for the detection of radiation in the infrared spectral range. To capture an image, a scene to be illuminated can be illuminated in the field of view of the illumination device 1, wherein the illumination device 1 provides both radiation in the visible spectral range and radiation in the infrared spectral range. These two radiation components can exit through a common opening in the housing 150, so that it is possible to dispense with an additional opening in the housing.

The radiation of the infrared pixels can be detected by the further radiation receiver 103 and, in addition to radiation components in the visible spectral range, can provide information in spatial resolution, which can be used to improve the image quality, for example, in low light conditions or at night.

Deviating from the described exemplary embodiment, the radiation receiver 102 can also be formed in such a way that it is also sensitive to the infrared radiation emitted by the infrared pixels 4. In this case, each pixel of the radiation receiver 102 can have a partial range for the detection of radiation in the red, green, blue and infrared spectral ranges. In this case, the further radiation receiver 103 can be dispensed with.

For example, the first radiation receiver 102 has an infrared filter that blocks radiation in the infrared spectral range and only transmits infrared radiation in the wavelength range of the radiation emitted by the infrared pixels.

By means of the described illumination device, the functionality of a light source in the visible spectral range and in the infrared spectral range can thus be integrated into an electronic device in a particularly space-saving manner and without an additional opening. This further increases the design possibilities for the electronic device compared to the need for multiple openings.

Figure 11:
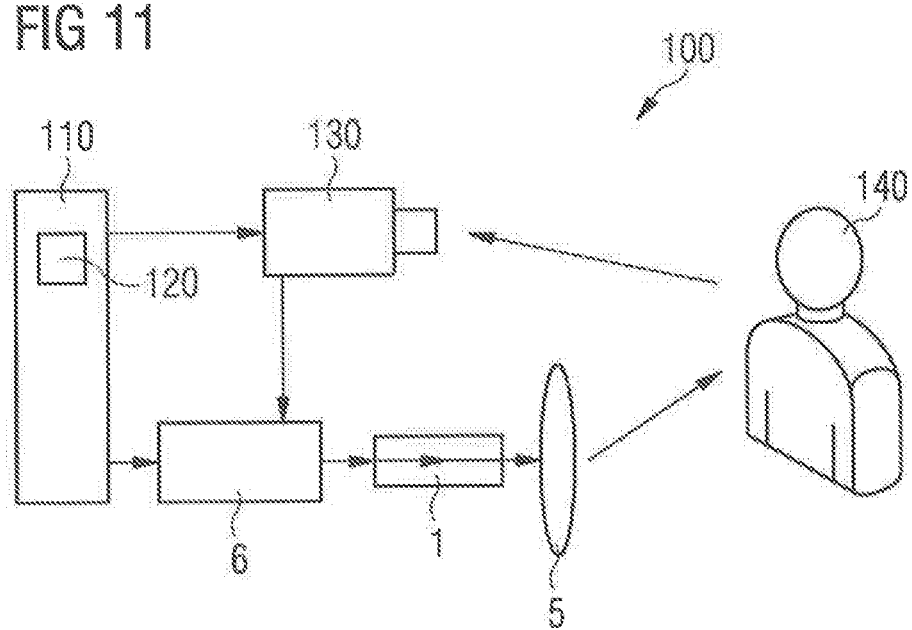
FIG. 11 shows an exemplary embodiment of a use of an illumination device.

FIG. 11 shows an exemplary embodiment of a use of the illumination device as a light source for biometric authentication.

For this purpose, illumination device 1 is integrated into a flashlight on the front of the electronic device, such as a smartphone. The radiation emitted by the infrared pixels is directed at a person to be identified 140 by means of the optical element 5. The infrared radiation illuminates the iris of the person 140 without a glare effect for the person. The radiation reflected by the iris can be picked up by a radiation receiver 130 and fed to an evaluation unit 120 of a controller 110 of the device 100. The illumination device thus offers authentication by means of an iris scan by illumination by the infrared pixels, without glaring the person to be identified in the dark.

The arrangement and the number of infrared pixels can be varied within wide limits.

For example, in the exemplary embodiment shown in FIG. 1A, the infrared pixels 4 are located only in a central region 29 of the first matrix arrangement 21 and the second matrix arrangement 22. An edge region 28 surrounding the central region in the form of a frame is free of infrared pixels or has at least fewer infrared pixels. Such an arrangement of the infrared pixels 4 is suitable, for example, for applications, in which the central region of the field of view 10 is predominantly to be illuminated with infrared radiation. This is the case, for example, when used for authentication using an iris scan where the human eye is typically located in the center of the field of view 15.

For example, the total number of pixels 31, 32 emitting in the visible spectral range is at least 50%, is at least twice as large or at least three times as large as the number of infrared pixels.

Of course, the illumination device can have only exactly one matrix arrangement 21 deviating from the exemplary embodiment described in FIGS. 1A and 1B. An optical element 5 with a plurality of segments 51 is not required in this case.

Figure 2:
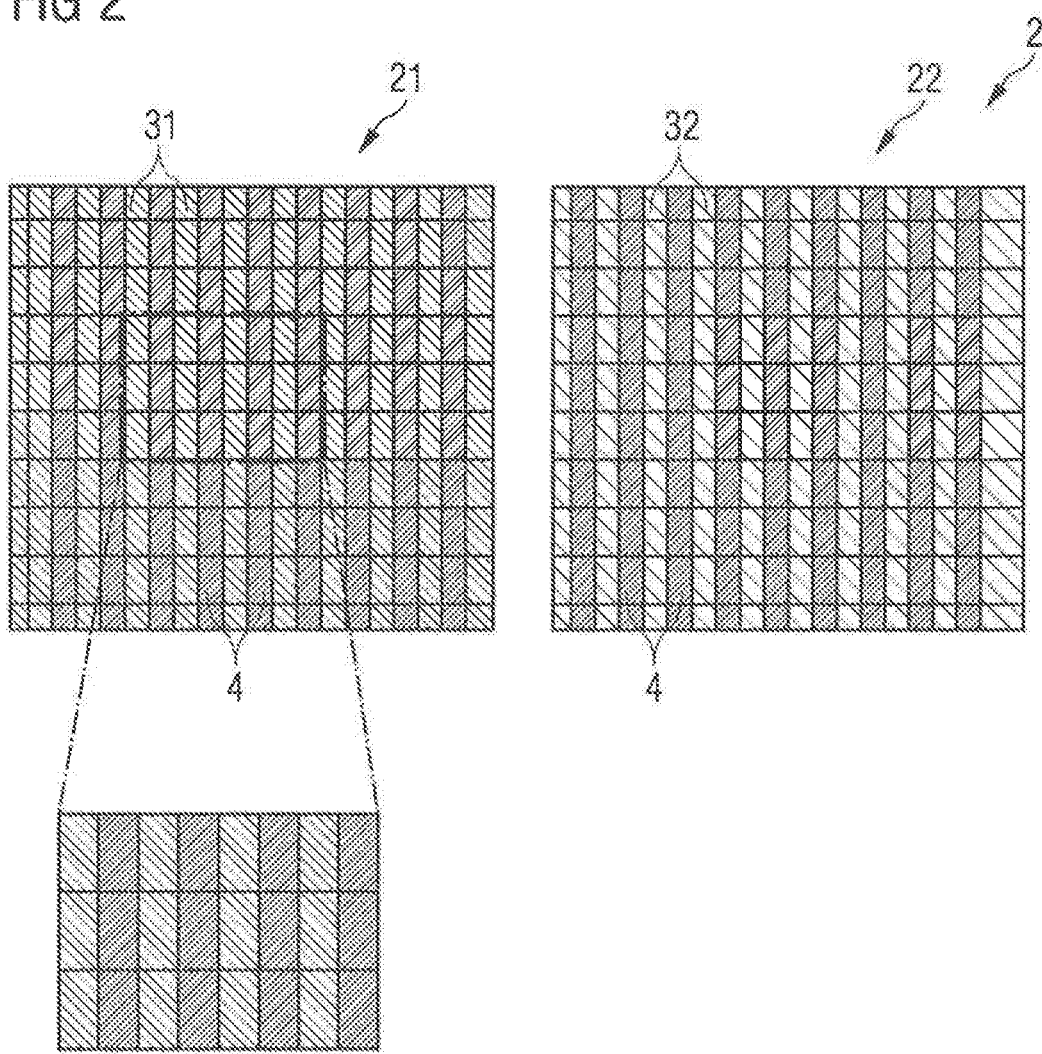
FIGS. 2, 3 and 4 show exemplary embodiments of a semiconductor component in plan view.

The exemplary embodiment for a semiconductor component 2 shown in FIG. 2 essentially corresponds to the exemplary embodiment described in connection with the FIGS. 1A and 1B. In contrast to this, the pixels of the first type 31 and the infrared pixels 4 of the first matrix arrangement 21 are arranged alternately in columns. The number of infrared pixels 4 is therefore equal to the number of pixels of the first type 31. The denomination as columns and rows of the matrix arrangement are interchangeable in this context.

Analogously, in the second matrix arrangement 22 the pixels of the second type 32 and the infrared pixels 4 are arranged alternately in columns. By providing an equal number of pixels of the first type 31 and infrared pixels 4 or pixels of the second type 32 and infrared pixels 4, respectively, it is easily ensured that an almost congruent region is associated with each of a subarea of a pixel of the first type or pixel of the second type illuminated in the visible spectral range which is irradiated by infrared pixels 4.

Figure 3:
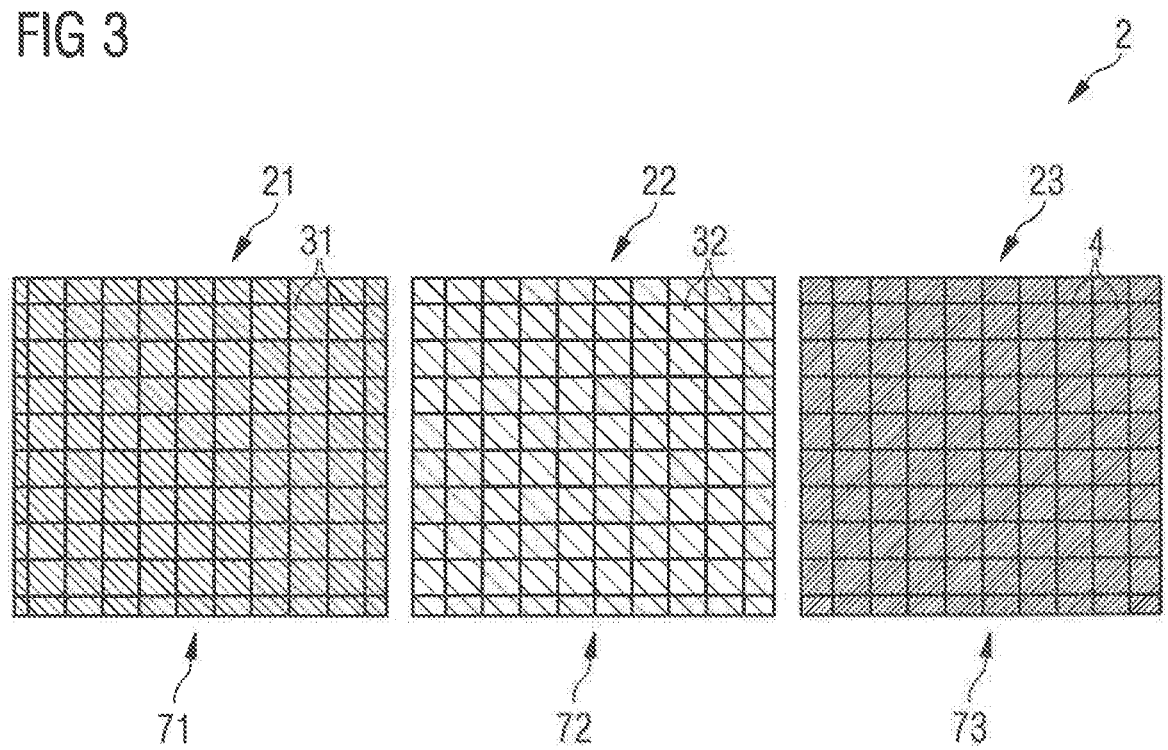

The exemplary embodiment of a semiconductor component shown in FIG. 3 is essentially the same as the exemplary embodiment described in FIGS. 1A and 1B.

In contrast, the semiconductor component 2 has a first matrix arrangement 21, a second matrix arrangement 22 and a third matrix arrangement 23. The first matrix arrangement 21 forms the pixels of the first type 31, the second matrix arrangement 22 forms the pixels of the second type 32 and the third matrix arrangement 23 forms the infrared pixels 4.

In the shown representation, the pixels of the first type 31, the pixels of the second type 32 and the infrared pixels 4 each have the same lateral extent. In each subarea of the field of view, radiation of an associated pixel of the first type, an associated pixel of the second type and/or an associated infrared pixel can be directed.

However, the number of infrared pixels 4 may be larger or smaller than the number of pixels of the first type 31 and pixels of the second type 32. In extreme cases it is conceivable that only one infrared pixel 4 is provided.

The matrix arrangements of the semiconductor component 2 or the matrix arrangements and the exactly one infrared pixel are preferably integrated into a common package in this exemplary embodiment.

This exemplary embodiment is characterized by a particularly simple predictability, since the integration of at least one infrared pixel 4 can take place without changing the structural structure of the first matrix arrangement 21 or the second matrix arrangement 22. Only the optical element 5 has to be adapted accordingly so that the radiation of the at least one infrared pixel or infrared pixels is also directed into the field of view.

Figure 4:
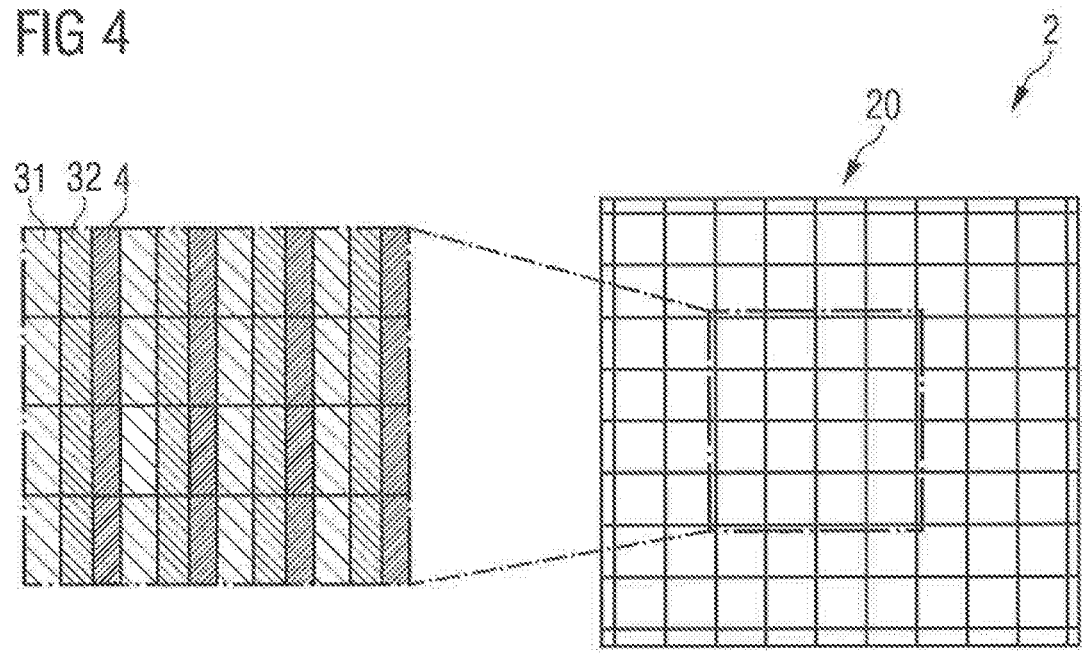

The exemplary embodiment of a semiconductor component shown in FIG. 4 is essentially the same as the exemplary embodiment described in FIGS. 1A and 1B.

In contrast, the pixels of the first type 31, the pixels of the second type 32 and the infrared pixels 4 are integrated in a common matrix arrangement 20. In this case, the optical element 5 therefore does not require any segments to superimpose the radiation emitted by adjacent matrix arrangements in associated subareas of a field of view. The requirements for the optical element 5 are thus reduced. Furthermore, a particularly compact form in the lateral direction can be realized, especially in comparison to matrix arrangements arranged next to one another.

Figure 5:
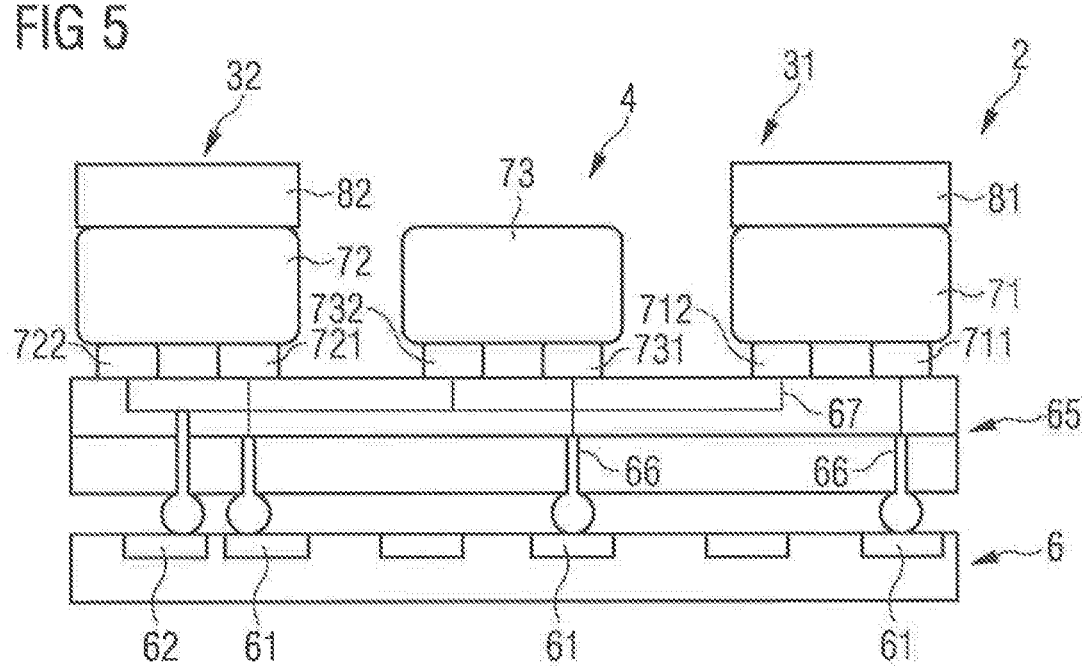
FIGS. 5, 6, 7, 8 and 9 show exemplary embodiments of a semiconductor component with control circuit in sectional views.
Figure 6:
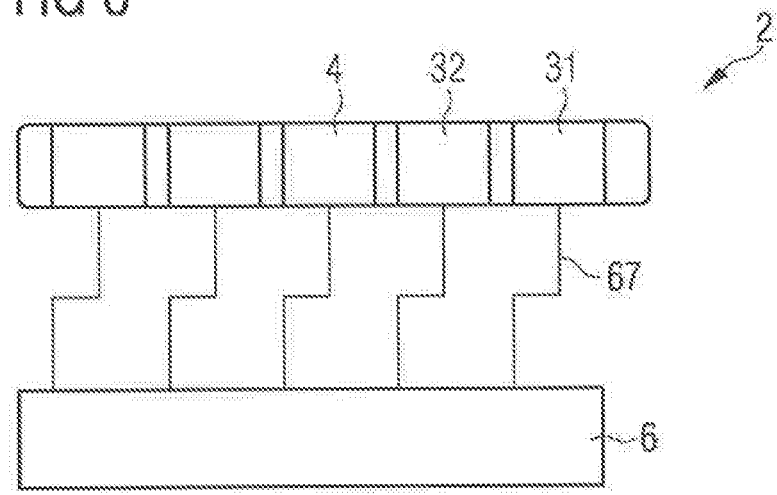

FIG. 5 shows an exemplary embodiment of a semiconductor component 2 with which, for example, a common matrix arrangement 20 as shown in FIG. 4 can be realized. The pixels of the first type 31, the pixels of the second type 32 and the infrared pixels 4 are arranged next to one another as separate first semiconductor chips 71, second semiconductor chips 72 and third semiconductor chips 73, respectively. The pixels of the first type 31 and the pixels of the second type 32 may each have semiconductor chips of the same type, so that the pixels of the first type 31 and the pixels of the second type 32 differ from one another only by the first radiation conversion element 81 and the second radiation conversion element 82 applied to the semiconductor chips 71 and 72, respectively.

For example, the first semiconductor chip 71 and the second semiconductor chip 72 each emit radiation in the blue spectral range. The first radiation conversion element 81 partially converts this radiation into radiation in the yellow, green and/or red spectral range, so that the pixels of the first type 31 emit mixed light that appears warm white.

In contrast, the second radiation conversion element 82 is formed in such a way that the radiation emitted by the pixels of the second type 32 appears cold-white in total.

For example, a thickness of the first radiation conversion element 81 and/or the second radiation conversion element 82 is between 40 µm and 100 µm inclusive, in particular between 60 µm and 80 µm inclusive. In contrast to a thinner radiation conversion element, this results in smoother transitions in the field of view between subareas to be illuminated. The radiation conversion elements therefore not only determine the color location of the radiated radiation, but also influence the spatial radiation characteristics.

The third semiconductor chips 73 for the infrared pixel 4 preferably have a different semiconductor material from the first semiconductor chips 71 and second semiconductor chips 72. For example, semiconductor chips based on arsenide compound semiconductor material are suitable for generating radiation in the infrared spectral range.

By forming the different pixels as separate semiconductor chips with regard to their radiation emission, the suitable semiconductor material can be selected according to the respective radiation generation. Such an arrangement can therefore be characterized by a particularly high efficiency of radiation generation.

Of course, the individual semiconductor chips can also form more than one pixel. For example, in the exemplary embodiment shown in FIG. 4, the first semiconductor chip 71 alone forms a column of the common matrix arrangement 20. This reduces the total number of semiconductor chips to be placed.

For an electrically conductive connection between the first semiconductor chips 71, the second semiconductor chips 72 and the third semiconductor chips 73, the semiconductor chips can be arranged next to one another in lateral direction on an intermediate carrier 65. The intermediate carrier 65 provides a simplified electrical contact between the semiconductor chips and the control circuit 6. For example, a contact 711 of the first semiconductor chip 71, a contact 721 of the second semiconductor chip 72 and a contact 731 of the third semiconductor chip 73 are each electrically conductively connected to a connection 61 of the control circuit 6. A counter contact 712 of the first semiconductor chip, a counter contact 722 of the second semiconductor chip and a counter contact 732 of the third semiconductor chip are electrically conductively connected to a common counter connection 62 of control circuit 6.

The electrical contact within the intermediate carrier 65 is made, for example, via supply lines 67 on or in the intermediate carrier. The supply lines can extend at different levels of the intermediate carrier in places. In plan view on the intermediate carrier, various supply lines can cross or overlap in places without being electrically conductively connected to one another. In the vertical direction, the supply lines extend through through-connections 66 to the control circuit, so that the control circuit 6 can be arranged directly below the semiconductor chips 71, 72, 73 intended for radiation generation.

Deviating from this, the control circuit 6 can also be arranged spatially separated from the semiconductor component 2 and electrically conductively connected to it via supply lines 67. This is shown schematically in FIG. 6. The vertical space requirement for the illumination device can thus be reduced.

Figure 7:
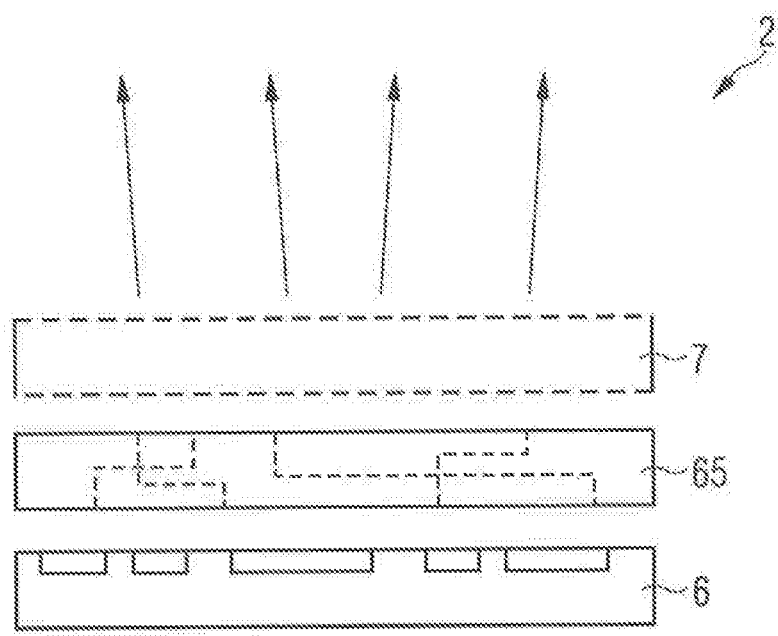

FIG. 7 shows an exemplary embodiment of a semiconductor component 2, in which several pixels are integrated into a common semiconductor chip 7. For example, several pixels of one type, for example, several pixels of the first type or several pixels of the second type or several infrared pixels are integrated into a common semiconductor chip. Furthermore, pixels of different types, such as pixels of the first type and infrared pixels or pixels of the second type and infrared pixels or pixels of the first type, pixels of the second type and infrared pixels, can be integrated into a common semiconductor chip.

Figure 8:
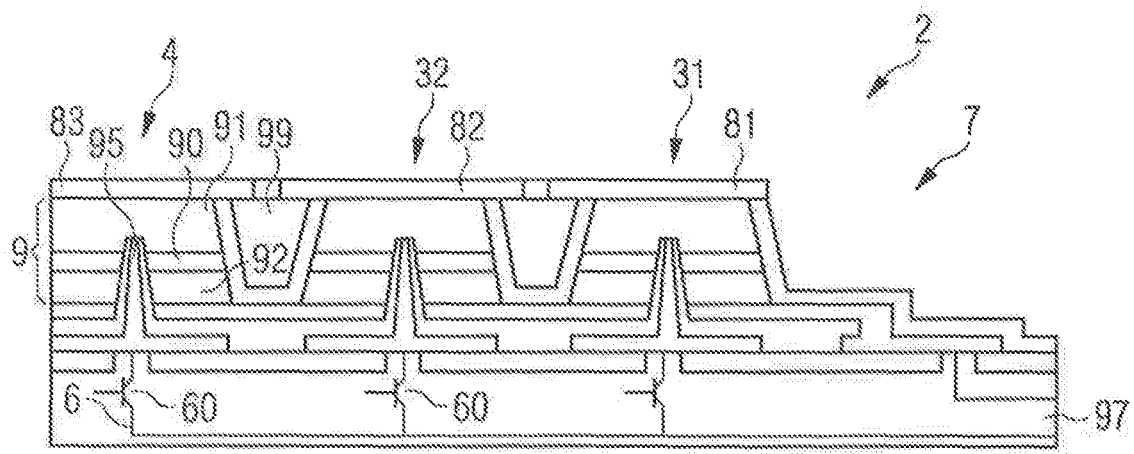

FIG. 8 shows an exemplary embodiment of a semiconductor component, in which several pixels are integrated into a semiconductor chip 7, as described in connection with FIG. 7.

The semiconductor chip 7 has an in particular epitaxially deposited semiconductor layer sequence 9 with an active region 90 intended for the generation of radiation, wherein the active region 90 is arranged between a first semiconductor layer 91 of a first conductivity type, for example, n-conductive, and a second semiconductor layer 92 of a second conductivity type, for example, p-conductive, being different from the first conductivity type.

The individual pixels, i.e., the pixels of the first type 31, the pixels of the second type 32 and the infrared pixels 4, in particular the active regions of these pixels emerge from a partial region of the semiconductor layer sequence 9.

In particular, these partial regions result from the same semiconductor layer sequence in the production of the semiconductor chip, so that the semiconductor layers of the individual pixels do not differ in terms of their material and layer thickness apart from production-related lateral fluctuations.

The individual pixels are separated from one another by intermediate spaces 99. The intermediate spaces 99 cut through in particular the active regions 90 of neighboring pixels. For example, the intermediate spaces cut through the entire semiconductor layer sequence in a vertical direction, i.e., perpendicular to a main plane of extension of the semiconductor layer sequence.

The semiconductor layer sequence 9 is arranged on a carrier 97. The carrier also serves for the mechanically stabilization of the semiconductor layer sequence 9, so that a growth substrate for the semiconductor layer sequence is no longer required for this and can therefore be removed.

A control circuit 6 with a plurality of switches 6o is arranged in the carrier 97. A switch 60 is associated with each pixel so that the individual pixels can be operated independently of one another during operation of the illumination device. At least part of the electrical control circuit, such as a switch, is thus integrated into the semiconductor chip.

The first semiconductor layer 91 arranged on the side of the active regions 90 facing away from the carrier 97 is electrically conductively connected to an associated switch 6o by means of recesses 95. The recesses extend through the second semiconductor layer 92 and the active region 90. The second semiconductor layers 92 of the pixels are electrically conductively connected to one another and can have the same electrical potential during operation of the illumination device 1. Both sides of the active region 90 are therefore accessible for electrical contact from the side facing the carrier 97. Of course, the electrical contact of the individual pixels can be varied within wide limits, as long as the individual pixels can be individually controlled and, during operation of the semiconductor component 2, charge carriers from opposite sides reach the active region 90 and can recombine there by emission of radiation.

On the side of the semiconductor layer sequence 9 facing away from the carrier 97, a first radiation conversion element 81, a second radiation conversion element 82 and a third radiation conversion element 83 respectively are associated with the pixels of the first type 31, the pixels of the second type 32 and the infrared pixels 4, respectively. The first radiation conversion element 81 and the second radiation conversion element 82 may be formed as described in connection with FIG. 5.

The third radiation conversion element 83 is formed to convert primary radiation generated in the active region 90 into secondary radiation in the infrared spectral range, in particular completely.

For example, a process which converts a photon in the blue spectral range into two photons in the infrared spectral range by excitation by short-wave radiation, for example, radiation in the blue spectral range, is also suitable for the radiation conversion. This physical effect is also known as "photon cutting". Alternatively, quantum dots that absorb radiation in the blue or ultraviolet spectral range and emit radiation in the infrared spectral range are suitable.

The exemplary embodiment of a semiconductor component 2 described in FIG. 9 corresponds substantially to the exemplary embodiment described in connection with FIG. 8. In contrast to this, a common first radiation conversion element 81 extends over the semiconductor chip 7. The semiconductor chip 7 forms a plurality of similar pixels, for example, a plurality of pixels of the first type 31. Of course, such a common radiation conversion element can also be used for the formation of similar pixels in the exemplary embodiment described in connection with FIG. 8.

Figure 9:
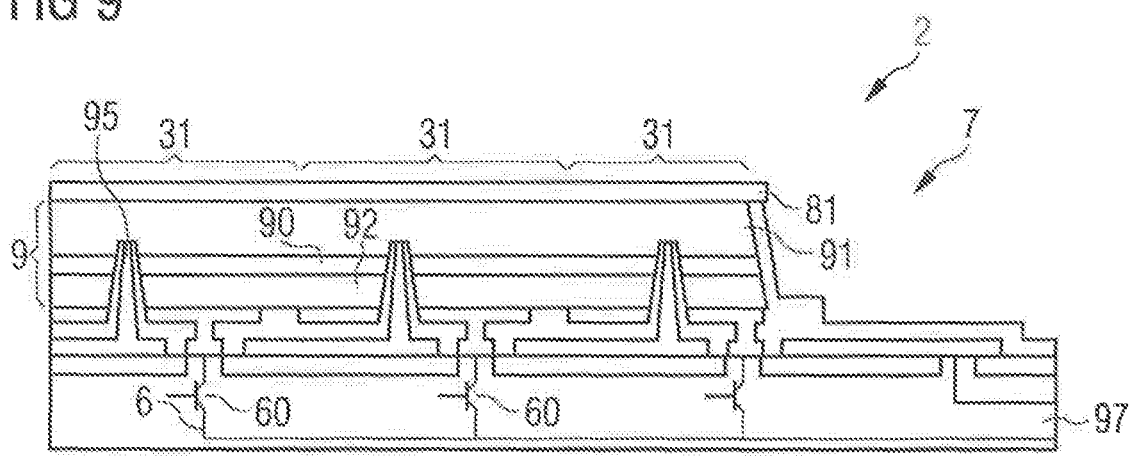

Furthermore, the semiconductor layer sequence 9 in the exemplary embodiment shown in FIG. 9 is not severed between adjacent pixels of the first type 31. The spatial separation between neighboring pixels is mainly due to the limited lateral current expansion in the electrical contact of the individual pixels. In the exemplary embodiment shown, the spatial expansion of the electrical connection to the second semiconductor layer 92 determines the lateral expansion of the radiation emission of a pixel of the first type 31.

Analogue, the pixels of the second type 32 and/or infrared pixels 4 can be formed by such a semiconductor chip.

This results in smooth transitions between the individual pixels of the first type 31. When such an illumination device is used as a segmented flash, the risk of too sharp transitions between subareas of the field of view to be illuminated to different degrees, which make images taken with such lighting could appear unnatural, is thus reduced.

Further embodiments of semiconductor chips with individually controllable pixels are described in U.S. Pat. Nos. 9,362,335 and 9,192,021 in connection with an adaptive front headlamp and a projection display. The entire disclosure content of these publications is hereby incorporated into the present application by reference. It has been shown that the basic type of the configuration and electrical contact of individual pixels in a common semiconductor chip for an illumination device for use in a flash is suitable.

Further embodiments of semiconductor chips with individually controllable emission regions are described in document US 2013/0249396 in connection with a signal lamp, for example, as a light source in a motor vehicle headlamp. The entire disclosure content of this publication is hereby incorporated into the present application by reference.

The invention is not limited by the description of the exemplary embodiments. Rather, the invention includes any new feature and any combination of features, which in particular includes any combination of features in the claims, even if that feature or combination itself is not explicitly mentioned in the claims or the exemplary embodiments.

The invention claimed is:

1. An illumination device comprising:
   at least one semiconductor component configured to generate radiation;
   an optical element configured to direct the radiation into a field of view to be illuminated; and
   a control circuit,
   wherein the semiconductor component has a plurality of pixels of a first type, each pixel configured to illuminate the field of view in regions with radiation in a visible spectral range,
   wherein the semiconductor component has a plurality of infrared pixels configured to illuminate the field of view at least in regions with radiation in an infrared spectral range,
   wherein the pixels of the first type are arranged in a first matrix arrangement and the plurality of infrared pixels are arranged in a second matrix arrangement,
   wherein the pixels of the first matrix arrangement are part of a first semiconductor chip and the pixels of the second matrix arrangement are part of a second semiconductor chip, and
   wherein the pixels of the first type and the plurality of infrared pixels are operable via the control circuit.

2. The illumination device according to claim 1,
   wherein the first semiconductor chip has an epitaxially grown semiconductor layer sequence, and
   wherein the pixels of the first type are formed from the same semiconductor layer sequence.

3. The illumination device according to claim 1,
   wherein the second semiconductor chip has an epitaxially deposited semiconductor layer sequence, and
   wherein the infrared pixels are formed from the same semiconductor layer sequence.

4. The illumination device according to claim 1, wherein the first matrix arrangement and the second matrix arrangement are laterally spaced apart from one another.

5. The illumination device according to claim 1, wherein the pixels of the first type and the infrared pixels are arranged in a common matrix arrangement.

6. The illumination device according to claim 5, wherein a surface coverage of infrared pixels in a central region of the common matrix arrangement is higher than in an edge region of the common matrix arrangement.

7. The illumination device according to claim 5, further comprising an intermediate carrier arranged between the control circuit and the first and second semiconductor chips, wherein the semiconductor chips are electrically conductively connected to the control circuit via the intermediate carrier.

8. The illumination device according to claim 5, wherein the pixels of the first type and the infrared pixels of the common matrix arrangement are integrated into a common semiconductor chip.

9. The illumination device according to claim 1, wherein the semiconductor component has a plurality of pixels of a second type configured to emit radiation in the visible spectral range.

10. The illumination device according to claim 9, wherein the pixels of the first type are configured to emit warm white light and the pixels of the second type are configured to emit cold white light.

11. The illumination device according to claim 9, wherein the pixels of the first type, the pixels of the second type and the infrared pixels are arranged in a common matrix arrangement.

12. The illumination device according to claim 9, wherein the pixels of the first type are arranged in the first matrix arrangement and the pixels of the second type are arranged in the second matrix arrangement, and wherein both the first matrix arrangement and the second matrix arrangement have a portion of the infrared pixels.

13. The illumination device according to claim 12, wherein each pixel of the first matrix arrangement is associated with a pixel of the second matrix arrangement such that the radiation emitted by these pixels overlap in the field of view.

14. The illumination device according to claim 1, further comprising a radiation conversion element associated with the pixels of the first type, wherein the radiation conversion element is configured to at least partially convert primary radiation into secondary radiation, and wherein the radiation conversion element has a thickness between 40 µm and 100 µm inclusive.

15. The illumination device according to claim 1, wherein a total luminous area of all infrared pixels is not more than 80% of a total luminous area of the pixels of the first type.

16. An electronic device comprising:
the illumination device according to claim 1; and
at least one radiation receiver configured to detect radiation radiated into the field of view and reflected back from the field of view.

17. The electronic device according to claim 16, further comprising an evaluation unit configured to generate a recording of the field of view based on the radiation received from the radiation receiver in a visible spectral range and in an infrared spectral range.

18. The electronic device according to claim 16, further comprising a housing with an opening through which both the radiation of the pixels of the first type and the radiation of the infrared pixels are emittable.

19. A method comprising:
using the illumination device according to claim 1 as a light source for a biometric authentication.

20. The method according to claim 19, wherein the authentication is performed by an iris scan using illumination by the infrared pixels.

* * * * *